(12) United States Patent
Ferguson

(10) Patent No.: US 11,390,184 B2
(45) Date of Patent: Jul. 19, 2022

(54) DYNAMIC STATE-OF-CHARGE BOUNDS FOR VEHICLE BATTERY MANAGEMENT

(71) Applicant: GM Cruise Holdings LLC, San Francisco, CA (US)

(72) Inventor: Kenneth Ramon Ferguson, Scottsdale, AZ (US)

(73) Assignee: GM Cruise Holdings LLC, San Francisco, CA (US)

( * ) Notice: Subject to any disclaimer, the term of this patent is extended or adjusted under 35 U.S.C. 154(b) by 166 days.

(21) Appl. No.: 16/718,697

(22) Filed: Dec. 18, 2019

(65) Prior Publication Data

US 2021/0188114 A1 Jun. 24, 2021

(51) Int. Cl.
| | | |
|---|---|---|
| H02J 7/00 | (2006.01) | |
| B60L 58/12 | (2019.01) | |
| B60L 58/16 | (2019.01) | |
| B60L 58/13 | (2019.01) | |
| G01R 31/392 | (2019.01) | |
| G01R 31/36 | (2020.01) | |

(52) U.S. Cl.
CPC ............. *B60L 58/12* (2019.02); *B60L 58/13* (2019.02); *B60L 58/16* (2019.02); *G01R 31/392* (2019.01); *H02J 7/005* (2020.01); *H02J 7/00036* (2020.01); *H02J 7/0048* (2020.01); *B60L 2240/70* (2013.01); *G01R 31/36* (2013.01); *Y02T 90/16* (2013.01)

(58) Field of Classification Search
CPC ......... B60L 58/12; B60L 58/13; B60L 58/16; B60L 2240/70; B60L 2260/32; G01R 31/36; G01R 31/392; H02J 7/00036; H02J 7/0048; H02J 7/005; Y02T 10/70; Y02T 10/72

USPC ............................................. 320/109; 701/22
See application file for complete search history.

(56) References Cited

U.S. PATENT DOCUMENTS

| | | | |
|---|---|---|---|
| 2015/0006002 A1* | 1/2015 | Yamane | ................. G06Q 50/28 701/22 |
| 2018/0050601 A1 | 2/2018 | Katanoda | |
| 2019/0039467 A1 | 2/2019 | Hortop et al. | |

FOREIGN PATENT DOCUMENTS

| | | |
|---|---|---|
| EP | 2662949 A1 | 11/2013 |
| WO | 2012095129 A2 | 7/2012 |

OTHER PUBLICATIONS

Cleveland, T., et al., "Developing Affordable Mixed-Signal Power Systems for Battery Charger Applications," Microchip Technology, Inc., 11 pages (Jun. 24, 2015).
PCT Invitation to Pay Additional Fees dated Aug. 17, 2020 in PCT Application No. PCT/US2019/068858; 15 pages.
PCT International Search Report and Written Opinion dated Oct. 9, 2020 in PCT/US2019/068858; 20 pages.

* cited by examiner

*Primary Examiner* — Zixuan Zhou
(74) *Attorney, Agent, or Firm* — Patent Capital Group

(57) ABSTRACT

There is disclosed herein examples of system and procedure for assigning state-of-charge profiles to vehicles to extend battery lives of batteries of the vehicles. Determining an optimal state-of-charge profile for the vehicle may take into account battery degradation of the battery of the vehicle and/or characteristics of an operational assignment to which the vehicle is being assigned. The state-of-charge profiles assigned to the vehicles may extend the battery life of the battery of the vehicle and reduce battery replacements of the battery.

20 Claims, 6 Drawing Sheets

DYNAMIC STATE-OF-CHARGE BOUNDS FOR VEHICLE BATTERY MANAGEMENT

TECHNICAL FIELD

The present disclosure relates generally to vehicles implementing batteries and, more specifically, to devices and methods for managing batteries in vehicles and fleets of vehicles for managing battery life.

BACKGROUND

Most vehicles have integrated batteries for either starting or powering the vehicles. As more electric vehicles, including electric cars, have been developed, the demands on the batteries within the vehicles have increased. The batteries can degrade over use and time causing the energy that the batteries can maintain per charge to be reduced. Once a battery has degraded to a point where the battery no longer can store enough energy for a vehicle's intended operational assignment, the battery or the vehicle needs to be replaced with a new battery to maintain the ability of the vehicle to perform the intended operational assignment. Replacing batteries can be costly and can add up to a significant cost, especially when multiple vehicles are being maintained.

BRIEF DESCRIPTION OF THE DRAWINGS

The following figures are provided with accompanying description to provide some examples for the understanding of the subject matter disclosed herein. A component may be labeled with a same reference numeral throughout the drawings to indicate that the component is the same component or includes the same features with other components labeled with the same reference numeral throughout the drawings where the same reference numeral is utilized.

DETAILED DESCRIPTION

Figure 1:
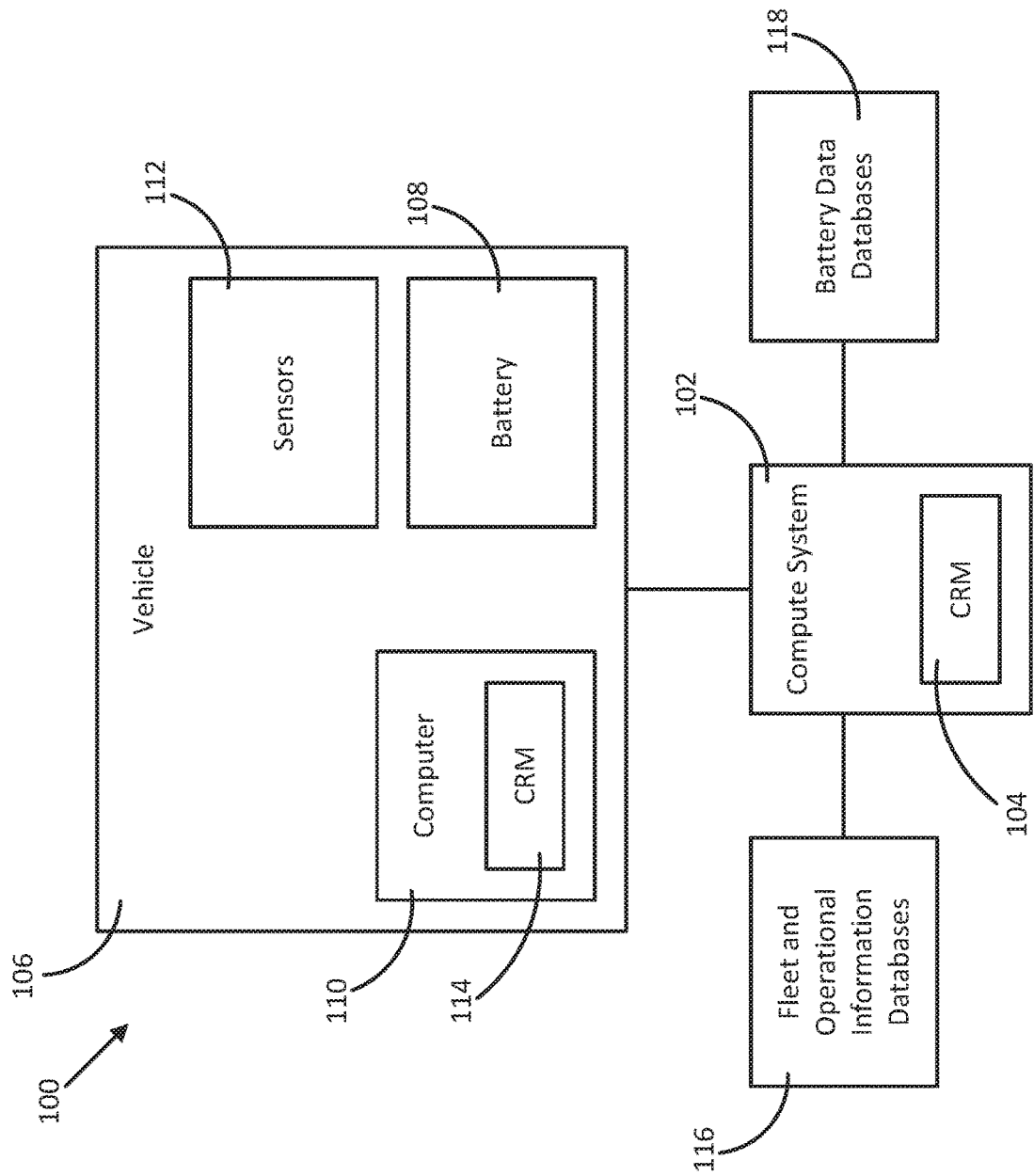
FIG. 1 illustrates an example battery management arrangement, according to embodiments described herein.

The following description and accompanying drawings provide some examples illustrating features of the subject matter described herein. The subject matter relates generally to autonomous vehicles and, more specifically, to devices and methods that produce a model for autonomous vehicles for identifying assertive vehicles.

Many vehicles implement a battery for operation, either to start the vehicle or to power and propel the vehicle. The cost of replacing the batteries when the batteries become too degraded to perform desired operational assignments can be relatively expensive, including when multiple vehicles are being maintained by a single entity. Accordingly, it can be beneficial to manage the batteries and vehicles to extend the battery life of the batteries and reduce the replacement of the batteries.

The systems and procedures described herein may manage batteries and vehicles with the goal of managing the battery life of the batteries. The systems and procedures may take into account battery degradation of the batteries when setting upper and lower state-of-charge limits for batteries during operation and selecting operational assignments for vehicles to extend a time until the batteries need to be replaced. Information related to a current state of battery degradation for a battery may be received from a vehicle and data from simulation models and/or fleet degradation can be utilized for predicting battery life of the battery for sets of upper and lower state-of-charge limits at the specific battery degradation.

There is disclosed herein examples of system and procedure for assigning state-of-charge profiles to vehicles to extend battery lives of batteries of the vehicles. Determining an optimal state-of-charge profile for the vehicle may take into account battery degradation of the battery of the vehicle and/or characteristics of an operational assignment to which the vehicle is being assigned. The state-of-charge profiles assigned to the vehicles may extend the battery life of the battery of the vehicle and reduce battery replacements of the battery.

As will be appreciated by one skilled in the art, features described herein may be embodied in various manners—e.g. as a method, a device, a system, a computer program product, a computer-readable medium, and/or other manners. Accordingly, features described herein may take the form of entirely hardware embodiments, entirely software embodiments (such as being implemented as one of more of firmware, resident software, micro-code, or other software implementations) or embodiments combining software and hardware aspects. Features of the subject matter described in the present disclosure may take the form of a computer program product. For example, the features may be implemented as instructions (such as program code) stored on one or more computer-readable medium(s) (such as non-transitory, computer-readable medium(s)) or one or more computer-readable medium(s) having instructions stored thereon, where the instructions, in response to execution by a device (such as a computer), cause the device to perform one or more operations. In various embodiments, the instructions may be stored on the computer-readable medium(s) during manufacturing of the computer-readable medium(s), or may be stored on the computer-readable medium(s) after manufacture of the computer-readable medium(s), including when the computer-readable medium(s) have been implemented within a device.

FIG. 1 illustrates an example battery management arrangement 100, according to embodiments described herein. The battery management arrangement 100 may include components of a system for managing deployment and operational assignments of one or more vehicles. The system may capture and store battery information (such as battery life profiles, discharge profiles, battery degradation information, and/or other battery information) for vehicles managed by the system. The system may also access simulation models and/or battery data from third parties (such as battery manufacturers). The system may utilize the battery information, the simulation models, and/or the battery data from third parties to determine optimal state-of-charge profiles for the batteries and/or assign operational assignments to the vehicles. The operational assignments may include areas in which the vehicles are to operate, times that the vehicles are to operate, uses of the vehicle (such as being utilized for commuter customers, being utilized for deliveries, and/or being utilized for other operations), or some combination thereof. The operational assignments may be fully determined or partially determined. In some instances, an operational assignment may comprise a projected usage for a vehicle or a suggested usage for the vehicle.

The battery management arrangement 100 may include a compute system 102. The compute system 102 may comprise a computer device or a networked group of computer devices, such as a computer, a server, a group of computers, a group of servers, or some combination thereof. The compute system 102 may include one or more computer-readable media 104 that stores instructions for the compute system 102. The one or more computer-readable media 104 may comprise non-transitory, computer-readable media. For example, the computer-readable media 104 may comprise one or more memory devices in some embodiments, where the memory devices store the instructions. The instructions, when executed by the compute system 102, may cause the compute system 102 to perform one or more of the operations performed by the compute system 102 as described throughout this disclosure.

The compute system 102 may manage operation of one or more vehicles. The compute system 102 may be communicatively coupled to the vehicles. The compute system 102 may be wirelessly coupled to the vehicles and/or wiredly coupled to the vehicles. The compute system 102 may receive data from the vehicles, and may provide instructions to the vehicles defining characteristics and/or operational assignments of the vehicles. For example, the compute system 102 may receive information regarding states of batteries of the vehicles from the vehicles and may utilize the information regarding the states of the batteries to assign state-of-charge profiles to the vehicles and operational assignments to the vehicles. The compute system 102 may further retrieve data (such as degradation data, discharge profiles, and/or simulation models) stored from previous operation of vehicles and/or from other databases (such as third-party databases).

The battery management arrangement 100 may further include one or more vehicles. The vehicle 106 may be communicatively coupled to the compute system 102 to facilitate communication between the vehicle 106 and the compute system 102. For example, the vehicle may be wirelessly and/or wiredly coupled to compute system 102 in instances. In the illustrated embodiment, a single vehicle 106 is illustrated and described for brevity and understanding, although it is to be understood that there may be one or more vehicles in other embodiments where the one or more vehicles include one or more features of the vehicle 106. In some embodiments, the vehicle 106 may comprise an autonomous vehicle (such as the autonomous vehicle 500 (FIG. 5)) in some embodiments, such as an autonomous automobile.

The vehicle 106 may include a battery 108. In some embodiments, the battery 108 may comprise a plurality of batteries and/or battery cells, where the plurality of batteries and/or battery cells may be coupled together in some embodiments and may be referred to as a battery pack. The battery 108 may provide power to the vehicle 106 to facilitate performance of one or more operations of the vehicle 106, such as the starting of the vehicle 106. In some embodiments, the vehicle 106 may comprise an electric vehicle, where the battery 108 may provide power for movement of the vehicle 106 among other operations of the vehicle 106. The battery 108 may be replaceable within the vehicle 106. For example, the battery 108 may be replaced with another battery, such as being replaced when the degradation level of the battery 108 degrades past a certain level and/or is no longer acceptable for operational assignments of the vehicle 106.

The vehicle 106 may include a computer 110. The computer 110 may include one or more computer-readable media 114 that stores instructions for the computer. The one or more computer-readable media 114 may comprise non-transitory, computer-readable media. For example, the computer-readable media 114 may comprise one or more memory devices in some embodiments, where the memory devices store the instructions. The instructions, when executed by the computer 110, may cause the computer 110 to perform one or more of the operations performed by the computer 110 as described throughout this disclosure. In some embodiments, the computer 110 may be one of multiple computers included in the vehicle 106. Each of computers may include one or more computer-readable media, such as the computer-readable media 114. Each of the computers may perform one or more of the procedures described throughout this disclosure and/or may control one or more of the systems of the vehicle 106. In some embodiments, the computers may operate in conjunction to control and/or facilitate operation of the vehicle 106.

The vehicle 106 may include a one or more sensors 112 coupled to the computer 110. The computer 110 may receive data captured by the sensors 112 and utilize the data received from the sensors 112 in controlling operation of the vehicle 106. A portion of the sensors 112 may be coupled to the battery 108 and may capture information regarding the battery state of the battery 108, such as a charge level of the battery 108 and/or a degradation level of the battery 108. For example, the sensors 112 may include a battery management system (BMS) coupled to the battery 108, where the BMS can monitor the battery state of the battery 108. The computer 110 may receive indications of the battery state of the battery 108 from the sensors 112 and determine operations to be performed by the vehicle 106 based on the battery state of the battery 108, such indicating and/or determining that the battery 108 is to be charged and indicating and/or determining that the battery 108 has been charged to an assigned level of charge. In embodiments where the vehicle 106, the computer 110 may further utilize the indication of the battery state of the battery 108 to perform operations to address conditions of the battery 108, such as causing the vehicle 106 to proceed to a charging station for charging the battery 108 in response to determining that the battery is to be charged and causing charging of the battery 108 to be stopped in response to determining the battery 108 have been charged to an assigned level of charge.

In some embodiments, the computer 110 may utilize the information regarding the battery state of the battery 108 to determine a degradation level of the battery 108. For example, the computer 110 may receive an indication of a degradation level of the battery 108 from a BMS in conjunction with sensors and determine the degradation level of the battery 108 based on the indication of the degradation level. In some embodiments, the computer 110 may utilize a current battery state of the battery 108 and previous captures of the battery state of the battery 108 to determine the degradation level of the battery 108. The computer 110 may determine a state-of-charge of the battery 108 based on a voltage of the battery 108, current drawn from the battery 108, temperature of the battery 108, other data related to the battery 108, or some combination thereof. The computer 110 may provide an indication of the battery state of the battery 108 to the compute system 102, where the indication of the battery state may include an indication of the degradation level of the battery. In some instances, the indication of the battery state of the battery 108 may be provided by the computer 110 to the compute system 102 in response to determining that there has been a change in the battery state of the battery 108.

In other embodiments, the computer 110 may receive the information regarding the battery state of the battery 108 and may generate an indication of the battery state of the battery 108. The computer 110 may provide the indication of the battery state of the battery 108 to the compute system 102 and the compute system 102 may determine the degradation level of the battery 108 based on the indication of the battery state. The compute system 102 may utilize degradation information from other sources (such as simulation models and/or degradation data captured from other vehicles) along with the indication of the degradation level to determine the degradation level of the vehicle.

The battery management arrangement 100 may further include one or more battery data databases 118. The battery data databases 118 may be communicatively coupled to the compute system 102 and the compute system 102 may retrieve data from the battery data databases 118. The battery data databases 118 may be stored on one or more servers and/or other memory devices.

The battery data databases 118 may store data related to charging and/or discharging of batteries, such as charging curves of the batteries and/or discharging curves of the batteries. For example, the data stored in the battery data databases 118 may include curves previously captured from vehicles and/or generated by performing simulations based on battery data, where the battery data may be provided by a third-party (such as the manufacturer of the battery 108) and/or produced based on the data related to the charging and/or discharging of the batteries previously captured from the vehicles. The charging and/or discharging data of the batteries may be associated with a corresponding battery and may show the battery degradation of the corresponding battery. In some embodiments, the charging and/or discharging data of the batteries stored by the battery data databases 118 may be associated with conditions in which the vehicles were operating when the data was captured or conditions for the simulation that was performed to generate the charging and/or discharging data. For example, the data may indicate environmental conditions (such as temperature, rain, and/or wind) that occurred while the data was being captured and that may affect the charging and/or discharging data of the batteries. The compute system 102 may retrieve portions of the charging and/or discharging data of the batteries from the battery data databases 118 and derive information from the charging and/or discharging data that can be utilized for determining battery degradation of the battery 108.

The battery management arrangement 100 may further include one or more fleet and operational assignment information databases 116. The fleet and operational assignment information databases 116 may be communicatively coupled to the compute system 102 and the compute system 102 may retrieve data from the fleet and operational assignment information databases 116. The fleet and operational assignment information databases 116 may be stored on one or more servers and/or other memory devices. The fleet and operational assignment information databases 116 may be stored on the same servers and/or memory devices as the battery data databases 118, on different servers and/or memory devices from the battery data databases 118, or some combination thereof.

The fleet and operational assignment information databases 116 may include data associated with the vehicles coupled to the compute system 102 and/or data associated with the operational assignments for vehicles. For example, the data stored in the fleet and operational assignment information databases 116 may include data received from the vehicles (such as the vehicle 106), data derived from data received from the vehicles, data derived from the charging and/or discharging data stored in the battery data databases 118, storage capacity of the batteries within the vehicles, or some combination thereof. Further, the fleet and operational assignment information databases 116 may include data indicating characteristics of the operational assignments and/or data regarding the assignments of the vehicles to the operational assignments.

In particular, the fleet and operational assignment information databases 116 may include data regarding power requirements of the operational assignments for vehicles and data regarding the amount of power available to each of the batteries within the vehicles. For example, the fleet and operational assignment information databases 116 may include data indicating the battery degradation of each of the batteries, amounts of energy that can be stored for each of the batteries, power requirements for the operational assignments, or some combination thereof. The data regarding power requirements of the operational assignments for vehicles and data regarding the amount of power available to each of the batteries within the vehicles may be utilized by the compute system 102 to determine whether each of the vehicles can perform each of the operational assignments for the vehicles.

The fleet and operational assignment information databases 116 may further include data regarding battery maintenance activities of each of the operational assignments. For example, the fleet and operational assignment information databases 116 may include data regarding battery maintenance activities providable during the operational assignments. The data regarding battery maintenance activities may include allowable charging frequency for the operational assignments (i.e., how often a battery may be charged during the operational assignments, which may be indicated as the minimum amount of time between which a vehicle can return to a charging station for charging of the battery during the operational assignment), allowable charge-times for the operational assignments (i.e., the maximum amount of time that a vehicle can remain at a charging station for a charge cycle of the battery during the operational assignment), amount of time the vehicle is to be on the road during the operational assignments, rates of charging available, or some combination thereof. The data regarding battery maintenance activity may be utilized by the compute system 102 to determine whether the battery maintenance activities for the operational assignments can facilitate the vehicles performing each of the operational assignments for the vehicles.

The fleet and operational assignment information databases 116 may further include data regarding demand and service of each of the operational assignments. For example, the fleet and operational assignment information databases 116 may include demand projections for each of the operational assignments. The demand projections may be based on time for the operational assignments, prior recorded demands for the operational assignments, activities occurring in the area of the operational assignments, or some combination thereof. Further, the fleet and operational assignment information databases 116 may include data regarding the number of vehicles assigned to each of the operational assignments and the state-of-charge profiles for the vehicles assigned to each of the operational assignments. The compute system 102 may utilize the demand projections, the number of vehicles assigned to the operational assignments, and/or the state-of-charge profiles to determine whether the number of vehicles assigned to the operational assignments can fulfill the demand projections. In response to determining that the vehicles assigned to an operational assignment do not satisfy the demand projections, the compute system 102 may assign additional vehicles to the operational assignment, or may attempt to identify additional vehicles that may be assigned to the operational assignment. Further, the compute system 102 may determine the effect of assigning one or more additional vehicles to an operational assignment on the vehicles already assigned to the operational assignment.

The fleet and operational assignment information databases 116 may further include data related to vehicle-specific information for each vehicle. For example, the fleet and operational assignment information databases 116 may include data regarding vehicle-specific degradation costs for each of the vehicles, vehicle age of each of the vehicles, battery age for batteries in each of the vehicles, cost of battery replacement for each of the batteries, effects on hardware of each of the vehicles, hardware arrangements of the vehicles (such as sensors of the vehicles, control systems of the vehicles, and/or software implemented on the vehicles), or some combination. The compute system 102 may utilize the vehicle-specific information to determine vehicle-specific current draw from the battery and/or the cost of replacing the battery.

The fleet and operational assignment information databases 116 may further include data related to costs, including operational costs, marginal costs, and/or incremental costs for operation of the vehicle. The data related to costs may include utility charge for electricity for charging the vehicle at certain times, energy conversion costs due to charger inefficiencies, cost due to battery degradation over a charge cycle, maintenance cost, cost to operate high-power draw components, and/or opportunity costs. The compute system 102 may utilize the costs for determining the cost of operating, or choosing not to operate, the vehicles.

The fleet and operational assignment information databases 116 may further include data related to environmental factors for the operational assignments. The data related to the environmental factors may include environmental data (such as temperature, wind, and/or rain) and route data (such as grades of the terrain) for the operational assignments. In some embodiments, the fleet and operational assignment information databases 116 may further include data indicating the effects of the environmental factors on current draw and/or charging due to regenerative braking for the operational assignments. The compute system 102 utilize the data related to the environmental factors to compensate for changes in the amount of charge required for the operational assignments and/or the current draw on the batteries of the vehicles when assigned to the operational assignments.

The compute system 102 may receive indications of battery states for the batteries of the vehicles coupled to the compute system 102 from the vehicles. The compute system 102 may retrieve data from the battery data databases 118 and/or the fleet and operational assignment information databases 116 and utilize the data to determine a degradation level of the batteries based on the indications of battery states and the data. The compute system 102 may further generate or update one or more state-of-charge profiles for each of the batteries based on the determined degradation level and the data from the battery data databases 118 and/or the fleet and operational assignment information databases 116. Each state-of-charge profile of the state-of-charge profiles may include an upper bound value that indicates a maximum optimal charge for the battery and a lower bound value that indicates a minimum optimal charge for the battery. The compute system 102 may rank the state-of-charge profiles for each battery based on battery life expectancies associated with the each of the state-of-charge profiles.

The compute system 102 may further determine operational assignments to be performed by vehicles. The operational assignments may be determined based on data retrieved from the fleet and operational assignment information database 116, such as the demand projections for the operational assignments and the number of vehicles assigned to the operational assignments. The compute system 102 may determine that an operational assignment should be assigned additional vehicles based on the number of vehicles being assigned to the operational assignment not fulfilling the demand projection for the operational assignments. In some instances, the compute system 102 may determine that an operational assignment should be assigned additional vehicles based on battery lives of the vehicles currently assigned to the operational assignment being extended by the addition of vehicles. In these instances, the extension of the battery lives of the vehicles currently assigned to the operational may exceed a threshold extension to be determined that additional vehicles should be assigned.

Once the operational assignments to be performed by the vehicles is determined, the compute system 102 may retrieve data from the fleet and operational assignment information databases 116 and determine vehicles that are available to be assigned to the operational assignments based on the data. The vehicles that are available to be assigned may be determined based on vehicles that are not assigned to another operational assignment at the time they will be assigned to the operational assignment or the vehicles would be more valuable in the operational assignment than the other operational assignment to which it was originally assigned.

The compute system 102 may determine characteristics for the operational assignments. For example, the characteristics may include the predicted amounts of energy for the operational assignments, the allowable charging frequency, the allowable charge-times, the amount of time the vehicles will be on the road, and/or the rate of charging available. Based on the characteristics, the compute system 102 may determine vehicles from the available vehicles that satisfy the characteristics of the operational assignments. The vehicles that satisfy the characteristics of the operational assignments may include any of the vehicles with at least one state-of-charge profile for the battery of the vehicle that meet or exceed the charge requirements defined by the characteristics of the operational assignments. In some instances, the compute system 102 may compare the state-of-charge profiles of the batteries in the available vehicles with the state-of-charge profiles of the batteries in the vehicles already assigned to the operational assignments to determine whether any of the state-of-charge profiles of the batteries in the available vehicles match the state-of-charge profiles of the batteries in the vehicles already assigned to the operational assignments. The available vehicles with any of the state-of-charge profiles of the batteries matching the state-of-charge profiles of the batteries in the vehicles already assigned to the operational assignments may be determined to satisfy the characteristics of the operational assignments. In other instances, a user of the compute system 102 may indicate the vehicles to be assigned to each of the operational assignments.

Once a vehicle has been determined to be assigned to an operational assignment, the compute system 102 may determine a state-of-charge profile of the battery within the vehicle to be implemented for the operational assignment. For example, the compute system 102 may have determined that the vehicle 106 is to be assigned to an operational assignment. The compute system 102 may have generated a plurality of state-of-charge profiles for the battery 108 based on the indication of the battery state of the battery 108 received from the vehicle 106. The compute system 102 may rank each of the state-of-charge profiles within the plurality of state-of-charge profiles based on the predicted battery life of the battery 108 when operated in accordance with the state-of-charge profile, where state-of-charge profiles with longer predicted battery lives are ranked higher than state-of-charge profiles with shorter predicted battery lives. The compute system 102 may begin by comparing the highest ranked state-of-charge profile from the plurality of the state-of-charge profiles for the battery 108 with characteristics for the operational assignment to determine whether the highest ranked state-of-charge profile satisfies the characteristics for the operational assignment. If the compute system 102 determines that the highest ranked state-of-charge profile satisfies the characteristics for the operational assignment the compute system 102 may assign the highest ranked state-of-charge profile to the vehicle 106 for use during the operational assignment. If the compute system 102 determines that the highest ranked state-of-charge profile fails to satisfy the characteristics for the operational assignment, the compute system 102 may remove the profile from the plurality of state-of-charge profiles of the battery 108 for the operational assignment. The compute system 102 may then compare the next highest ranked state-of-charge profile from the plurality of state-of-charge profiles for the battery 108 with the characteristics for the operational assignment to determine whether the next highest ranked state-of-charge profile satisfies the characteristics for the operational assignment. The compute system 102 may continue proceeding through the plurality of state-of-charge profiles for the battery 108 in a descending rank order until one state-of-charge profiles is determined to satisfy the characteristics for the operational assignment. The state-of-charge profile that is determined to satisfy the characteristics for the operational assignment may be assigned to the vehicle 106. The compute system 102 may provide an indication to the vehicle 106 indicating the characteristics of the state-of-charge profile to be implemented.

Figure 2:
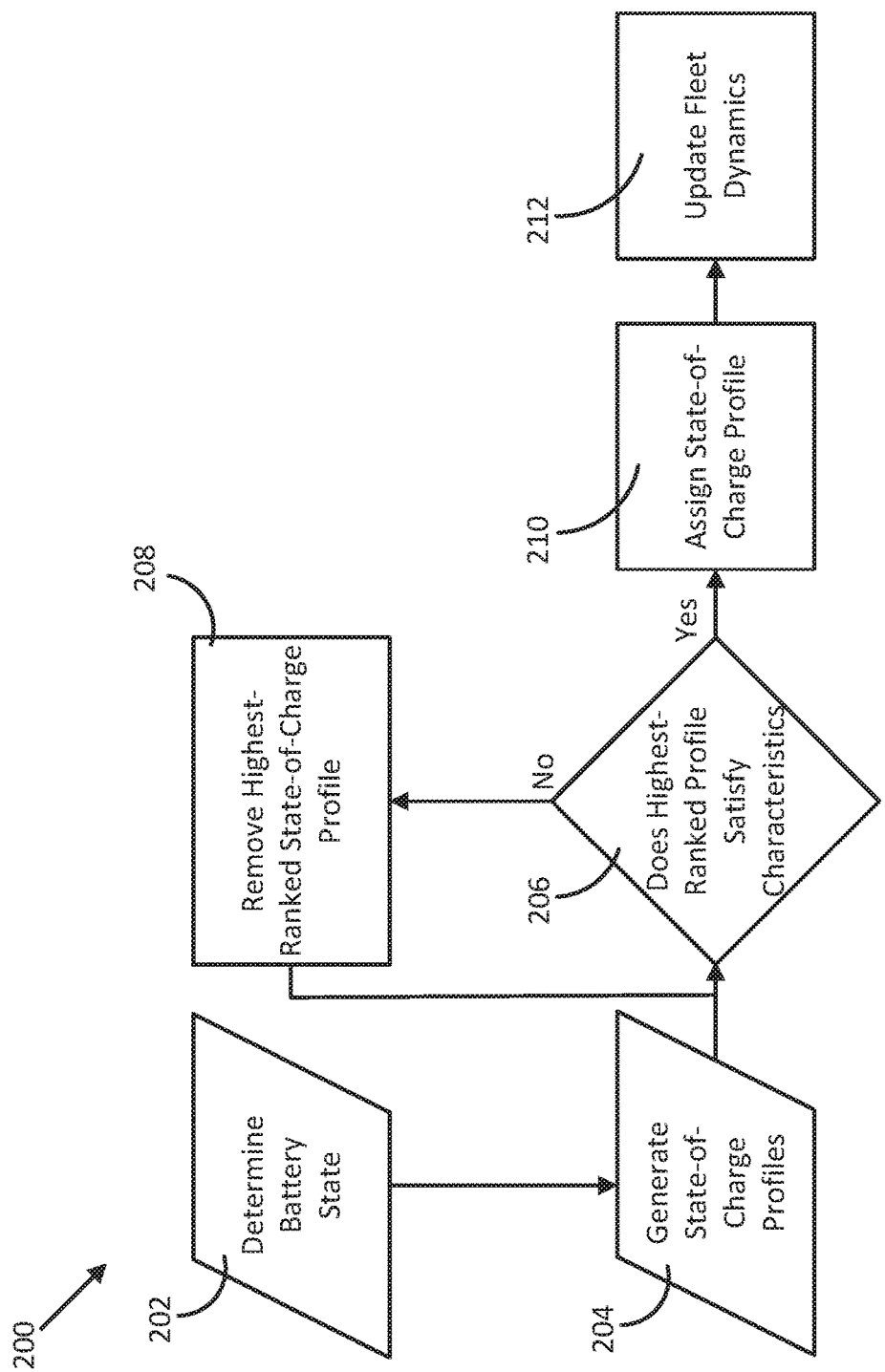
FIG. 2 illustrates an example procedure for setting dynamic state-of-charge limits for a battery, according to embodiments described herein.

FIG. 2 illustrates an example procedure 200 for setting dynamic state-of-charge limits for a battery, according to embodiments described herein. The procedure 200 may be performed by the compute system 102 (FIG. 1). In particular, the compute system 102 may perform the procedure 200 to assign a state-of-charge profile to a vehicle (such as the vehicle 106 (FIG. 1)).

In stage 202, a battery state of a battery (such as the battery 108 (FIG. 1)) may be determined. Determining the battery state of the battery may include receiving an indication of a battery state from the vehicle in which the battery is connected. The indication of the battery state may include an indication of the degradation level. A degradation level of the battery may be determined based on the battery state.

In stage 204, one or more state-of-charge profiles may be generated or updated for the battery. The state-of-charge profiles generated may be potential state-of-charge profiles that may be implemented by the vehicle for management of charging and discharging of the battery. The state-of-charge profiles may be generated based on data associated with the states of the batteries of the vehicles, data associated with the state of the vehicle, data previously captured, or derived from data previously captured, from vehicles, and/or data produced by, or derived from the data produced by, simulations, laboratory test environments, and/or closed test environments. The state-of-charge profiles may each include an upper bound value for the battery and a lower bound value for the battery. The upper bound value and the lower bound value may for each state-of-charge profile may be set to provide a long battery life of the battery as compared to other values that could be set for the upper bound value and the lower bound value. The values of the upper bound value and the lower bound value to provide the long battery life may be determined based on curves previously captured from vehicles, simulations based on battery data (as may be stored in the battery data databases 118 (FIG. 1)), and/or other data that may be stored in the fleet and operational assignment information databases 116 (FIG. 1) and/or the battery data databases 118. The upper bound value may indicate a maximum optimal charge for the battery, where the battery is to be charged to the maximum optimal charge when the battery is being charged. The lower bound value may indicate a minimum optimal charge for the battery, where the battery is to be charged based on the charge of the battery reaching the minimum optimal charge. The battery reaching the minimum optimal charge may indicate that a vehicle in which the battery is connected should return to a charging station to have the battery charged. In instances where more than one state-of-charge profile is generated for a battery, the upper bound values and the lower bound values may differ in the different state-of-charge profiles and may cause different expected battery lives for each of the state-of-charge profiles. Each of the state-of-charge profiles may have a battery life that exceeds a threshold battery life. In some embodiments, the state-of-charge profiles may further include an indication of charging rate at which the battery should be charged when charging of the battery occurs. Generating the state-of-charge profiles may further include ranking the state-of-charge profiles based on expected battery life of the state-of-charge profiles. State-of-charge profiles with higher expected battery lives may be higher ranked than state-of-charge profiles with lower expected battery lives.

In some embodiments, generating the state-of-charge profiles may further include ranking the state-of-charge profiles based on operating costs of the state-of-charge profiles. In particular, the operating costs for each of the state-of-charge profiles may be determined. State-of-charge profiles with lower operating costs may be higher ranked than state-of-charge profiles with higher operating costs. The state-of-charge profiles may further be filtered based on expected battery life of the state-of-charge profiles. For example, state-of-charge profiles that present an expected battery life below a threshold battery life may be filtered from the state-of-charge profiles.

Further, a user may define the characteristics for ranking and/or filtering of the state-of-charge profiles. For example, a user of the compute system may indicate any characteristics that may be received and/or derived from data available to the compute system related to batteries of the vehicles. The compute system may utilize the characteristics defined by the user to rank and/or filter state-of-charge profiles.

In stage 206, a determination may be made whether a state-of-charge profile from the state-of-charge profiles satisfies characteristics of an operational assignment to which the vehicle is to be assigned. The state-of-charge profile utilized in the determination may be the highest ranked state-of-charge profile within the state-of-charge profiles for the battery at the time the determination is being performed. The characteristics of the operational assignment may include a predicted amount of energy for the operational assignment, an allowable charging frequency, allowable charge-times, an amount of time the vehicles will be on the road, and/or a rate of charging available. For example, the amount of energy that can be stored by the battery based on the state-of-charge profile can be compared against the predicted amount of energy for the operational assignment to determine whether the battery can store enough energy to perform the operational assignment based on the state-of-charge profile. Further, the time to charge the battery in accordance with the state-of-charge profile may be compared to the allowable charge-times for the operational assignment to determine whether the battery can be charged in accordance with the state-of-charge profile with the operational assignment in some embodiments. If it is determined that the battery cannot store enough energy to perform the operational assignment and/or the battery cannot be charged in accordance with the state-of-charge profile with the operational assignment, the state-of-charge profile may be determined as failing to satisfy the characteristics of the operational assignment. If it is determined that the battery can store enough energy to perform the operational assignment and, in embodiments where time to charge the battery is compared, the battery can be charged in accordance with the state-of-charge profile, the state-of-charge profile may be determined to satisfy the characteristics of the operational assignment. If the state-of-charge profile is determined as failing to satisfy the characteristics of the operational assignment, the procedure 200 may proceed to stage 208. If the state-of-charge profile is determined to satisfy the characteristics of the operational assignment, the procedure 200 may proceed to stage 210.

In stage 208, the state-of-charge profile that was determined as failing to satisfy the characteristics of the operational assignment may be removed from the state-of-charge profiles generated for the battery. With the state-of-charge profile removed from the state-of-charge profiles, the next highest ranked state-of-charge profile may be utilized in the procedure 200 for assigning a state-of-charge profile to the vehicle. In particular, stage 206 may be performed with the next highest ranked state-of-charge profile to determine if the next highest ranked state-of-charge profile satisfies the characteristics of the operational assignment. The procedure 200 may continue with determining whether any of the state-of-charge profiles in accordance with stage 206 and stage 208 until one of the state-of-charge profiles within the state-of-charge profiles for the battery satisfies the characteristics of the operational assignment or until all the state-of-charge profiles generated for the battery have been removed via stage 208. If all the state-of-charge profiles generated for the battery has been removed, the battery may be deemed unsatisfactory for the operational assignment and the vehicle may not be assigned to the operational assignment. In some instances, the battery may be scheduled for replacement based on the battery being deemed unsatisfactory for the operational assignment.

In stage 210, the state-of-charge profile determined to satisfy the characteristics of the operational assignment may be assigned to the vehicle. In particular, an indication of the state-of-charge profile may be provided to the vehicle. The vehicle may implement the state-of-charge profile in response to receiving the indication. Implementing the state-of-charge profile may include setting an upper bound value to which the battery is to be charged to the upper bound value of the state-of-charge profile and setting a lower bound value at which the battery is to be charged and/or an indication that the battery should be charged is triggered to the lower bound value of the state-of-charge profile. In some embodiments, implementing the state-of-charge profile may include setting a maximum charge rate for the battery to a charge rate of the state-of-charge profile. The vehicle may implement the state-of-charge profile while the vehicle is assigned to the operational assignment.

The state-of-charge profile may be manually implemented within the vehicle in some embodiments, where a user of a vehicle may input (such as via a user interface of the vehicle) the state-of-charge profile to be utilized by the vehicle. Further, the user of the vehicle may cause values of the state-of-charge profile to be changed in some embodiments, where the vehicle may implement the updated values for the state-of-charge profile. The user of the vehicle may further cause the vehicle to cause operations separate from the state-of-charge profile, such as causing the vehicle to return to a charging station for charging prior to the battery state reaching the lower bound value.

In some embodiments, the state-of-charge profile may be implemented by a user of the vehicle. For example, information of the state-of-charge profile (such as the upper bound value, the lower bound value, and/or other information related to the state-of-charge profile) may be provided to a user of the vehicle, such as being displayed on a display of the vehicle. In some embodiments, indications can be displayed to the user in response to an action to be taken based on the state-of-charge profile, such as an indication that the vehicle should be recharged in response to battery state reaching the lower bound value. The user may operate in accordance with the state-of-charge profile.

In stage 212, fleet dynamics may be updated based on the assignment of the vehicle to the operational assignment. Updating the fleet dynamics may include updating data regarding vehicles stored in a database (such as the fleet and operational assignment information database 116 (FIG. 1)). The updates to the data may include updating the assignment of the vehicle and/or updating the state-of-charge profile being utilized for the vehicle in the database. In some embodiments, operational assignments and/or state-of-charge profiles for other vehicles may be updated based on the assignment of the vehicle to the operational assignment. For example, other vehicles coupled to a compute system 102 performing the procedure 200 may have operational assignments and/or state-of-charge profiles updated. The updates may include reassigning the vehicles from the current operational assignment, changing amounts of time that the vehicles are to be on the road for the operational assignment, changing the upper bound value and/or the lower bound value of the state-of-charge profiles implemented by the vehicles, changing the maximum charge rate for the battery of the vehicle, changing the allowable charge-time for the operational assignment, or some combination thereof.

Figure 3:
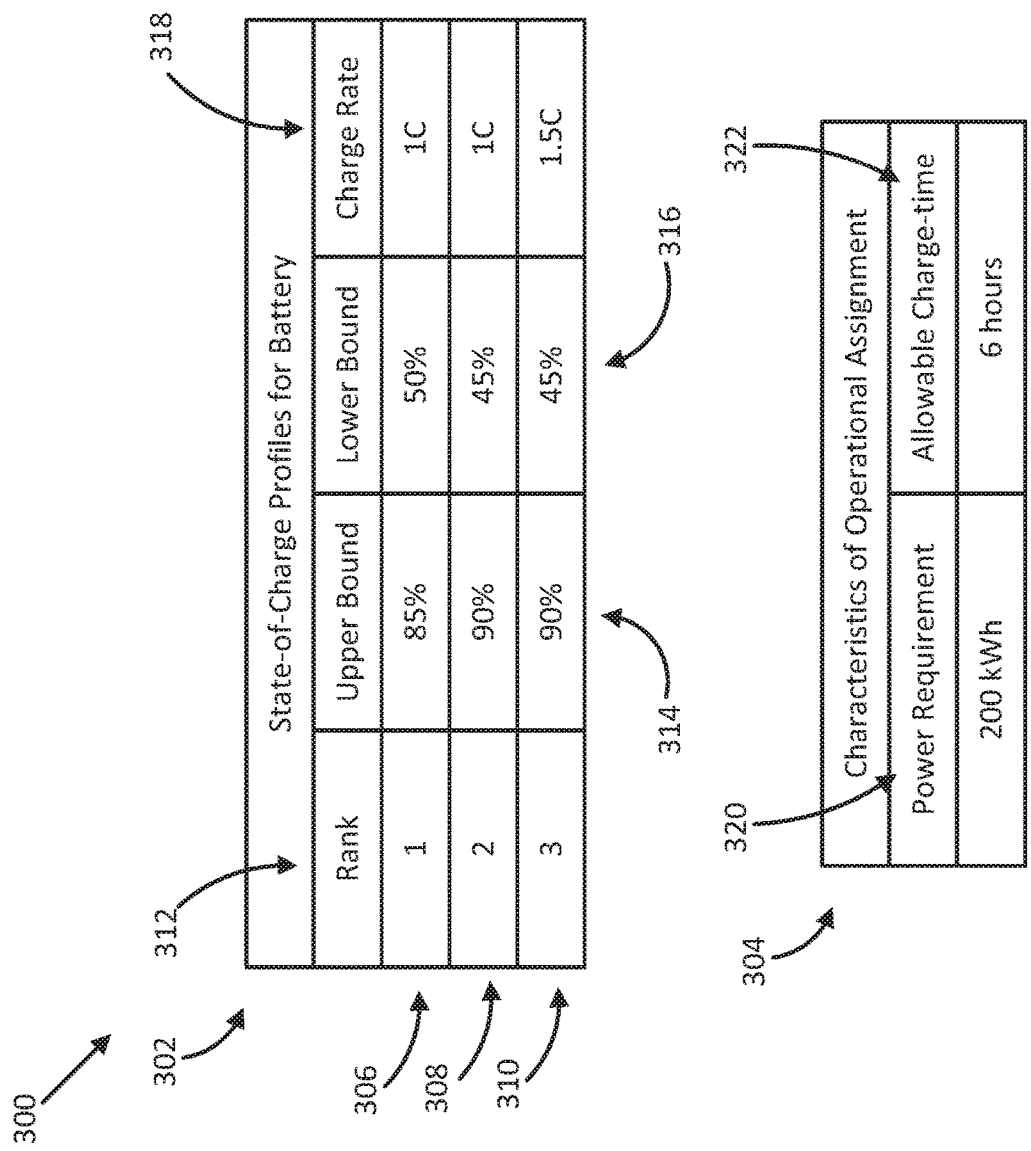
FIG. 3 illustrates an example diagram illustrating a determination of a state-of-charge profile for a vehicle for an operational assignment.

FIG. 3 illustrates an example diagram 300 illustrating a determination of a state-of-charge profile for a vehicle for an operational assignment. In particular, the diagram 300 includes a first table 302 illustrating a plurality of state-of-charge profiles for a battery and a second table 304 illustrating characteristics of the operational assignment. The characteristics of the operational assignment may be utilized for determining the state-of-charge profile to be assigned to the vehicle for performance of the operational assignment.

The first table 302 illustrates a plurality of state-of-charge profiles for a battery. The state-of-charge profiles may be generated by a compute system (such as the compute system 102 (FIG. 1)) during a procedure for assigning a state-of-charge profile to a vehicle (such as the procedure 200 (FIG. 2)). The first table 302 illustrates a first state-of-charge profile 306, a second state-of-charge profile 308, and a third state-of-charge profile 310. Each of the state-of-charge profiles may be assigned a rank 312, an upper bound value 314, a lower bound value 316, and a charge rate 318. For example, the first state-of-charge profile 306 is assigned a rank of 1, an upper bound value of 85%, a lower bound value of 50%, and a charge rate of 1 C. In the illustrated embodiment, the upper bound value 314 and lower bound value 316 may refer to a percentage of the capacity of the battery, while in other embodiments other measurements of battery charge may be utilized to define the upper bound value 314 and the lower bound value 316, such as the voltage of the battery. While there are three state-of-charge profiles illustrated for the battery in the illustrated embodiment, it should be understood that one or more state-of-charge profiles may be generated for the battery in other embodiments. Further, the charge rate 318 may be omitted from the state-of-charge profiles for the battery in some embodiments. In some embodiments, the state-of-charge profiles may include a rank (such as rank 312), an upper bound value (such as upper bound value 314), a lower bound value (such as the lower bound value 316), a charge rate (such as the charge rate 318), a charge profile (which may include a charge rate, a taper, a temperature, a current, and/or a voltage), or some combination thereof.

The second table 304 illustrates characteristics of an operational assignment. In the illustrated embodiment, the characteristics of the operational assignment may include a power requirement 320 for the operational assignment and an allowable charge-time 322 for the operational assignment. For example, the allowable charge-time 322 may include a maximum amount of time that a vehicle can remain at a charging station for a charge cycle of a battery of the vehicle during the operational assignment. In other embodiments, the characteristics of the operational assignment may include one or more of the elements related to an operational assignment stored in a database (such as the fleet and operational assignment information database 116 (FIG. 1)). In some embodiments, any of the characteristics and/or elements related to operational assignment (such as the power requirement 320, the allowable charge-time 322, and/or other elements related to the operational assignment stored in the database) may be considered for determining the state-of-charge profiles of the battery.

The state-of-charge profile for the vehicle may be determined based on the state-of-charge profiles for the battery, as shown in the first table 302, and characteristics of the operational assignment, as shown in the second table 304. For example, the upper bound value 314, the lower bound value 316, and/or the charge rate 318 for one or more of the state-of-charge profiles may be compared with the power requirement 320 and the allowable charge-time 322 of the operational assignment to determine a state-of-charge profile to be assigned to the vehicle in the illustrated embodiment. A storage capacity may further be utilized for determining an amount of power that the battery can store based on the upper bound value 314 and the lower bound value 316 of the state-of-charge profiles and/or determining an amount of time to charge the battery based on the upper bound value 314, the lower bound value 316, and the charge rate 318 of the state-of-charge profiles in the illustrated embodiment.

For example, a compute system may begin by comparing the upper bound value 314, the lower bound value 316, and the charge rate 318 for the highest ranked state-of-charge profile with the power requirement 320 and the allowable charge-time 322 in the illustrated embodiment to determine whether the highest ranked state-of-charge profile satisfies the characteristics of the operational assignment. In the illustrated embodiment, the first state-of-charge profile 306 is the highest ranked state-of-charge profile for the battery. In some instances, the compute system may determine that the first state-of-charge profile 306 fails to satisfy the characteristics of the operational assignment based on the available power stored on the battery according to the upper bound value 314 and the lower bound value 316 of the first state-of-charge profile 306 being less than the power requirement 320 of the operational assignment, and/or the amount of time to charge the battery according to the upper bound value 314, the lower bound value 316, and the charge rate 318 being longer than the allowable charge-time 322 of the operational assignment. Based on the first state-of-charge profile 306 failing to satisfy the characteristics of the operational assignment, the first state-of-charge profile 306 may be removed from the state-of-charge profiles for the battery.

Based on the first state-of-charge profile 306 being removed from the state-of-charge profiles, the next highest ranked state-of-charge profile may be compared to the characteristics of the operational assignment to determine whether the next highest ranked state-of-charge profile satisfies the characteristics of the operational assignment. In the illustrated embodiment, the second state-of-charge profile 308 is the next highest ranked state-of-charge profile. In some instances, the compute system may determine that the available power stored on the battery according to the upper bound value 314 and the lower bound value 316 of the second state-of-charge profile 308 is equal to or greater than the power requirement 320 of the operational assignment and, therefore, satisfies the power requirement 320 of the operational assignment. However, the compute system may determine that the amount of time to charge the battery based on the upper bound value 314, the lower bound value 316, and the charge rate 318 of the second state-of-charge profile 308 is greater than he allowable charge-time 322 of the operational assignment. Accordingly, the compute system may determine that the second state-of-charge profile 308 fails to satisfy the characteristics of the operational assignment based on the amount of time to charge the battery failing to meet the allowable charge-time 322 of the operational assignment. The compute system may remove the second state-of-charge profile 308 from the state-of-charge profiles for the battery due to the second state-of-charge profile 308 failing to meet the characteristics of the operational assignment.

The compute system may compare the next highest ranked state-of-charge profile to the characteristics of the operational assignment to determine whether the next highest ranked state-of-charge profile satisfies the characteristics of the operational assignment. In the illustrated embodiment, the third state-of-charge profile 310 is the next highest ranked state-of-charge profile. In some instances, the compute system may determine that the available power stored on the battery according to the upper bound value 314 and the lower bound value 316 of the third state-of-charge profile 310 is equal to or greater than the power requirement 320 of the operational assignment and, therefore, satisfies the power requirement 320 of the operational assignment. Further, the compute system may determine that the amount of time to charge the battery based on the upper bound value 314, the lower bound value 316, and the charge rate 318 is equal to or less than the allowable charge-time 322 of the operational assignment. Accordingly, the compute system may determine that the third state-of-charge profile 310 satisfies the characteristics of the operational assignment. The compute system may assign the third rate-of-charge profile 310 to the vehicle based on the third state-of-charge profile 310 satisfying the characteristics of the operational assignment.

Figure 4:
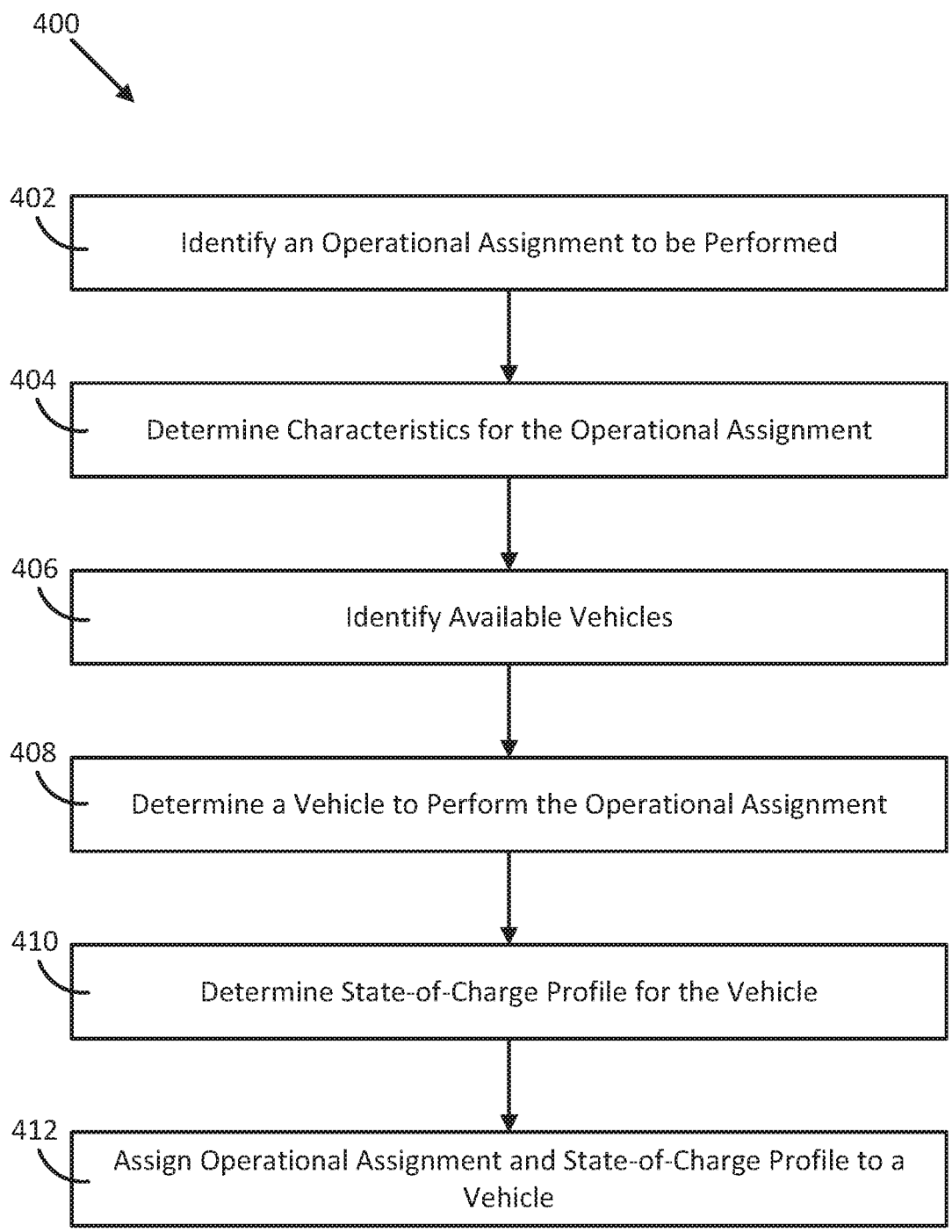
FIG. 4 illustrates an example procedure for assigning a vehicle to an operational assignment, according to embodiments described herein.

FIG. 4 illustrates an example procedure 400 for assigning a vehicle to an operational assignment, according to embodiments described herein. The procedure 400 may be performed by a compute system (such as the compute system 102 (FIG. 1)) for assigning a vehicle to an operational assignment.

In stage 402, the compute system may identify an operational assignment to be performed. Identifying the operational assignment may include identifying an operational assignment where the current vehicles assigned to the operational assignment fails to satisfy a demand projection for the operational assignment. In other instances, the compute system may receive an indication of the operational assignment to be performed from a user of the compute system.

In stage 404, the compute system may determine the characteristics of the operational assignment. The compute system may determine the characteristics of the operational assignment based on data associated with the operational assignment that may be captured from vehicles performing the operational assignment, derived from data from vehicles performing the operational assignment, and/or generated via simulations (such as the data associated with operational assignments stored in the fleet and operational assignment information database 116 (FIG. 1) and/or the battery data databases 118 (FIG. 1)). In some embodiments, the characteristics of the operational assignment may include a power requirement (such as the power requirement 320 (FIG. 3)) and an allowable charge-time (such as the allowable charge-time 322 (FIG. 3)) of the operational assignment. In other embodiments, the compute system may determine one or more characteristics of the operational assignment, which may or may not include the power requirement and/or the allowable charge-time.

In stage 406, the compute system may identify one or more available vehicles, where the available vehicles may perform the operational assignment. For example, the compute system may access information regarding assignments of vehicles (which may be stored in the fleet and operational assignment information database 116) to determine which vehicles have not been assigned to an operational assignment. Based on the vehicles not being assigned to an operational assignment, the compute system may determine that the vehicles are available to be assigned to the operational assignment. In some embodiments, the compute system may consider vehicles that have been assigned to an operational assignment and may determine whether reassignment of one or more of the vehicles would be beneficial based on data accessible by the compute system (such as the data stored on the operational assignment information database 116 and/or the battery data databases 118). In some embodiments, the compute system may receive an indication from a user of the compute system of a vehicle to be assigned to the operational assignment and identify the vehicle as the available vehicle based on the indication.

In stage 408, the compute system may determine a vehicle to assign to the operational assignment. In particular, the compute system may consider the available vehicles identified in stage 406 and may compare data for the available vehicles with the characteristics for the operational assignment to determine the vehicle to assign to the operational assignment. In some embodiments, the compute system may select a vehicle to be assigned to the operational assignment from the available vehicles based on the vehicle having a longest predicted battery life based on the comparison of the data for the available vehicles with the characteristics for the operational assignment. In other embodiments, the compute system may select a vehicle to be assigned to the operational assignment from the available vehicles based on the vehicle having the same state-of-charge profile available as other vehicles assigned to the operational assignment, or predicted battery life for the highest ranked state-of-charge profile for the battery of the vehicle being the longest predicted battery of life of the state-of-charge profiles for the batteries of the available vehicles. In instances where the compute system receives the indication from a user of the vehicle to be assigned to the operational assignment, the compute system may determine that the indicated vehicle is the vehicle to assign to the operational assignment based on the indication.

In stage 410, the compute system may determine a state-of-charge profile for the vehicle from potential state-of-charge profiles for the battery of the vehicle. For example, the compute system may perform the procedure 200 (FIG. 2) for determining the state-of-charge profile for the vehicle to be utilized for the operational assignment. The compute system may select the highest ranked state-of-charge profile from the potential state-of-charge profiles for the battery that satisfies the characteristics of the operational assignment for the vehicle.

In stage 412, the compute system may assign the operational assignment and the state-of-charge profile to the vehicle. For example, the compute system may provide an indication of the operational assignment and the determined state-of-charge profile to the vehicle. The vehicle may perform the operational assignment and implement the state-of-charge profile for the operational assignment in response to receiving the indication of the operational assignment and the determined state-of-charge profile.

Figure 5:
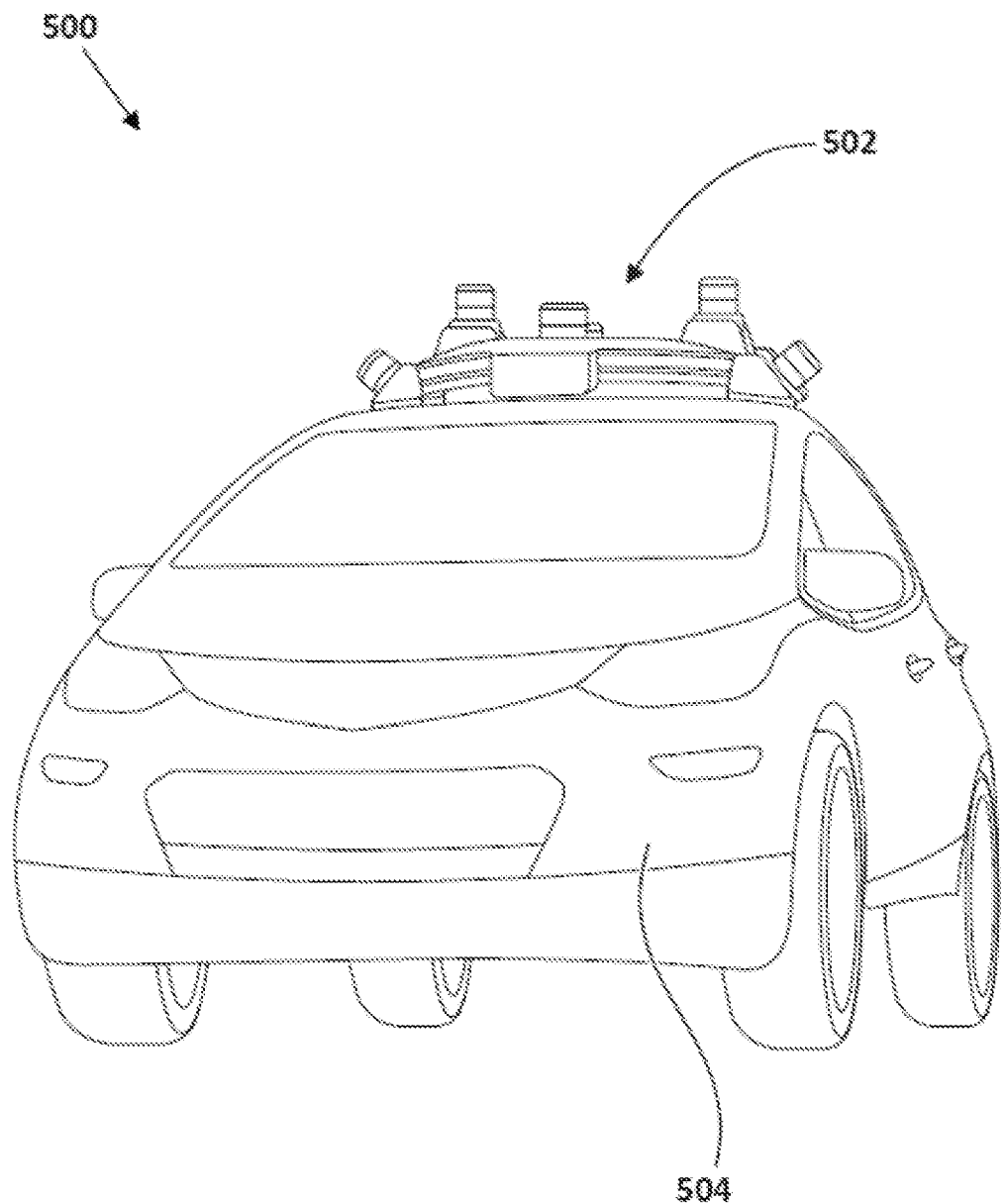
FIG. 5 illustrates an example autonomous vehicle, according to embodiments described herein.

FIG. 5 illustrates an example autonomous vehicle 500, according to embodiments described herein. The autonomous vehicle 500 is an example of a vehicle (such as the vehicle 106 (FIG. 1)) that may be coupled to a compute system (such as the compute system 102 (FIG. 1)). The autonomous vehicle 500 may be assigned to an operational assignment and may be assigned a state-of-charge profile as described throughout this disclosure. Further, the vehicle 500 may capture data and provide data to the compute system to be stored, or utilized to derive data to be stored, in the fleet and operational assignment information databases 116 (FIG. 1) and/or the battery data databases 118 (FIG. 1).

The autonomous vehicle 500 may comprise a car 504. The autonomous vehicle 500 may include one or more sensors 502 mounted to the car 504. The sensors 502 may be mounted to various locations on the car 504. For example, the sensors 502 may be mounted to a roof of the car 504, side mirrors of the car 504, a front of the car 504, a back of the car 504, sides of the car 504, or some combination thereof.

The sensors 502 may include one or more cameras, one or more light detection and ranging (LIDAR) sensors, one or more radar sensors, or some combination thereof. In some embodiments, the radar sensors may include articulating radar sensors, long-range radar sensors, short-range radar sensors, or some combination thereof. The sensors 502 may detect the surroundings of the autonomous vehicle 500. For example, the sensors 502 may detect one or more objects surrounding the autonomous vehicle 500, such as other cars, pedestrians, trees, bicycles, objects within a road on which the autonomous vehicle 500 is traveling (such as construction and/or other objects that may impede movement of the vehicle), and/or indications surrounding the autonomous vehicle 500 (such as construction signs, stop indicators, and other street signs).

In some embodiments, the sensors 502 may further include sensors to detect route data of the roads on which the autonomous vehicle 500 is traveling. For example, the sensors may detect the grades of the roads as the autonomous vehicle 500 travels along the roads. Further, the sensors 502 may include sensors that capture environmental data surrounding the autonomous vehicle 500. For example, the sensors may capture temperature, wind speed, rainfall, or some combination thereof of the environment in which the autonomous vehicle 500 is traveling.

In some embodiments, the sensors 502 may further include sensors to detect a battery state of the battery (such as the battery 108 (FIG. 1)) of the autonomous vehicle 500. In some of these embodiments, the sensors 502 may include a BMS to detect a battery state of the battery. For example, the sensors to detect the battery state may detect a level of charge of the battery, battery degradation of the battery, or some combination thereof.

The autonomous vehicle 500 may further include a computer coupled to the sensors 502. The computer may receive data captured by the sensors 502 and utilize the data for localization, perception, prediction, route planning, maneuver planning, motion planning, path following, and low level controls of the autonomous vehicle 500. Further, the computer may be communicatively coupled to a server and/or compute system (such as the compute system 102 (FIG. 1)) and may exchange communications with the server and/or the compute system. The computer may further be coupled to one or more of the systems of the autonomous vehicle 500 and may control operation of throttle, braking, steering, and/or indicators of the autonomous vehicle 500.

Figure 6:
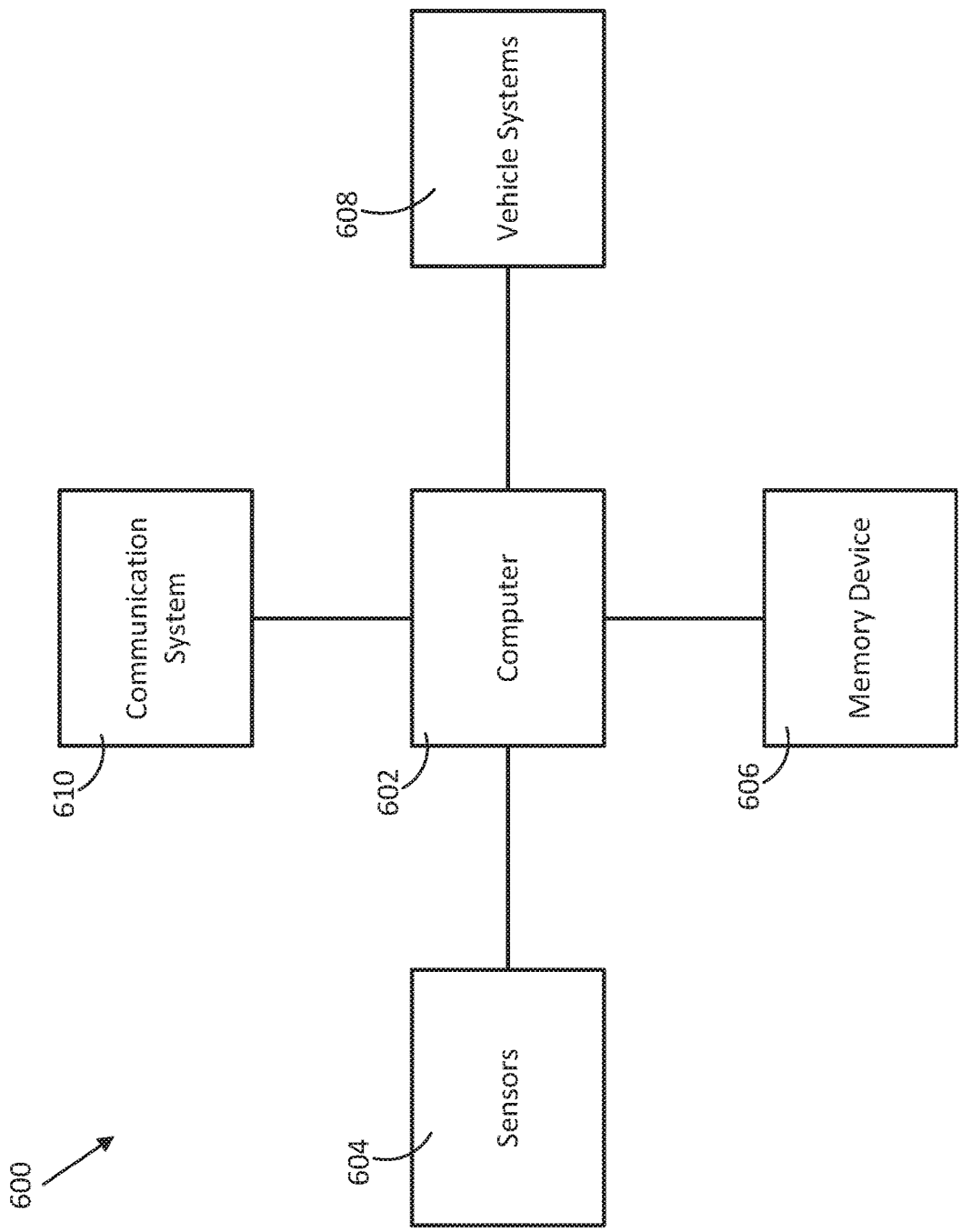
FIG. 6 illustrates example components that can be implemented within an autonomous vehicle, according to embodiments described herein.

FIG. 6 illustrates example components 600 that can be implemented within an autonomous vehicle, according to embodiments described herein. In particular, the components 600 may be implemented in the autonomous vehicles described throughout, such as the autonomous vehicle 500.

The components 600 may include a computer 602. The computer 602 may include one or more of the features of the computer described in relation to FIG. 5. The computer 602 may coordinate one or more operations of the autonomous vehicle and may analyze data captured by the autonomous vehicle.

The components 600 may further include one or more sensors 604. The sensors 604 may include one or more of the features of the sensors 502. The sensors 604 may be coupled to the computer 602 and may provide data captured by the sensors 604 to the computer 602.

The components 600 may further include one or more memory devices 606. The memory device 606 may be coupled to the computer 602. In some embodiments, the memory device 606 may also be coupled to the sensors 604. The memory devices 606 may be comprise computer-readable media. In some embodiments, the computer-readable media may be non-transitory computer-readable media. The memory devices 606 may store one or more instructions that, when executed by the computer 602, cause the computer 602 to perform one or more operations described throughout this disclosure being performed by a computer implemented in an autonomous vehicle. Further, the memory devices 606 may be utilized for storing data of the autonomous vehicle. For example, the computer 602 may provide the data received from the sensors 604 to the memory devices 606 for storage on the memory devices 606. Further, the memory device 606 may store routes associated with route planning of the autonomous vehicle, maneuvers associated with maneuver planning of the autonomous vehicle, or some combination thereof.

The components 600 may further include one or more vehicle systems 608. The vehicle systems 608 may be coupled to the computer 602 and the computer 602 may control operation of the vehicle systems 608. The vehicles systems 608 may include motion systems of the autonomous vehicle, indicator systems of the autonomous vehicle, or some combination thereof. The motion systems may include a throttle system, a braking system, a steering system, or some combination thereof, of the autonomous vehicle.

The components 600 may further include a communication system 610. The communication system 610 may be coupled to the computer 602. The communication system 610 may comprise a wireless communication system and may allow the computer 602 to wirelessly communicate with other devices, such as servers, analysis systems, and/or compute systems (such as the compute system 102 (FIG. 1)). The communication system 610 may implement one or more wireless communication standards, such as cellular communication standards, radar communication standards, satellite communication standards, global position system communication standards, Wi-Fi communication standards, and/or Bluetooth communication standards.

SELECT EXAMPLES

Below are provided some examples of embodiments in accordance with the subject matter provided in this disclosure. It should be understood that the examples are merely some examples and embodiments in accordance with the disclosed subject matter are not limited to the provided examples.

Example 1 may include one or more computer-readable media having instructions stored thereon, wherein the instructions, when executed by a compute system, cause the compute system to identify an indication of battery state of a battery of a vehicle received from the vehicle, determine a state-of-charge profile for the battery based on the battery state, and provide an indication of the state-of-charge profile to the vehicle, the vehicle to implement the state-of-charge profile in response to receipt of the indication of the state-of-charge profile.

Example 2 may include the one or more computer-readable media of example 1, wherein the state-of-charge profile includes an upper bound value that indicates a maximum optimal charge for the battery and a lower bound value that indicates a minimum optimal charge for the battery.

Example 3 may include the one or more computer-readable media of example 2, wherein the state-of-charge profile includes a rate of charging for the battery.

Example 4 may include the one or more computer-readable media of example 1, wherein the instructions, when executed by the compute system, further cause the compute system to generate a plurality of state-of-charge profiles for the battery based on the battery state, wherein the plurality of the state-of-charge profiles includes the state-of-charge profile, and rank the plurality of state-of-charge profiles based on expected battery life for each of the state-of-charge profiles within the plurality of state-of-charge profiles, wherein the state-of-charge profile is determined based on a rank of the state-of-charge profile.

Example 5 may include the one or more computer-readable media of example 4, wherein the state-of-charge profile is a first state-of-charge profile, and wherein the instructions, when executed by the compute system, further cause the compute system to determine an operational assignment for the vehicle, determine one or more characteristics for the operational assignment, determine whether a second state-of-charge profile within the plurality of state-of-charge profiles satisfies the one or more characteristics for the operational assignment, and remove the second state-of-charge profile from the plurality of the state-of-charge profiles in response to a determination that the second state-of-charge profile fails to satisfy the one or more characteristics for the operational assignment.

Example 6 may include the one or more computer-readable media of example 4, wherein the instructions, when executed by the compute system, further cause the compute system to determine an operational assignment for the vehicle, and determine one or more characteristics of the operational assignment, wherein the first state-of-charge profile is determined further based on the one or more characteristics of the operational assignment.

Example 7 may include the one or more computer-readable media of example 6, wherein the one or more characteristics of the operational assignment include allowable charging frequency and allowable charge-times.

Example 8 may include one or more computer-readable media having instructions stored thereon, wherein the instructions, when executed by a compute system, cause the compute system to identify an operational assignment to be performed, determine one or more characteristics for the operational assignment, compare state-of-charge profiles for a plurality of vehicles to the one or more characteristics for the operational assignment, wherein the state-of-charge profiles for the plurality of vehicles are determined based on battery states of batteries of the plurality of vehicles, and assign the operational assignment to a vehicle from the plurality of vehicles based on the comparison.

Example 9 may include the one or more computer-readable media of example 8, wherein the characteristics include allowable charging frequency, allowable charge-times, or expected energy use associated with the operational assignment.

Example 10 may include the one or more computer-readable media of example 8, wherein the instructions, when executed by the compute system, further cause the compute system to determine marginal costs, operational costs, or vehicle-specific degradation costs for each of the plurality of vehicles for the operational assignment, wherein the operational assignment is further assigned to the vehicle based on the marginal costs, operational costs, or vehicle-specific degradation costs for each of the plurality of vehicles.

Example 11 may include the one or more computer-readable media of example 8, wherein the instructions, when executed by the compute system, further cause the compute system to identify environmental data or route data for the operational assignment, and modify a portion of the one or more characteristics for the operational assignment based on the environmental data or the route data identified, wherein the modified portion of the one or more characteristics for the operational assignment are utilized for the comparison of the state-of-charge profiles for the plurality of vehicles to the one or more characteristics for the operational assignment.

Example 12 may include the one or more computer-readable media of example 8, wherein the state-of-charge profiles for each vehicle within the plurality of vehicles includes include one or more sets of optimal state-of-charge profiles for a battery of the vehicle, and wherein each set of the one or more sets of optimal state-of-charge profiles includes a maximum optimal charge for the battery and a minimum optimal charge for the battery.

Example 13 may include the one or more computer-readable media of example 8, wherein the instructions, when executed by the compute system, further cause the compute system to identify an indication of battery state of a battery of the vehicle, and update state-of-charge profiles for the vehicle based on the indication of the battery state.

Example 14 may include the one or more computer-readable media of example 8, wherein the instructions, when executed by the compute system, further cause the compute system to identify state-of-charge profiles for a fleet of vehicles assigned to the operational assignment, wherein to compare the state-of-charge profiles for the plurality of vehicles to the characteristics for the operational assignment includes to compare the state-of-charge profiles for the plurality of vehicles to the state-of-charge profiles for the fleet of vehicles assigned to the operational assignment.

Example 15 may include the one or more computer-readable media of example 8, wherein the instructions, when executed by the compute system, cause the compute system to select a state-of-charge profile for the vehicle from state-of-charge profiles for the vehicle based on the comparison of the state-of-charge profiles for the plurality of vehicles to the characteristics for the operational assignment, and assign the state-of-charge profile to vehicle for the operational assignment.

Example 16 may include the one or more computer-readable media of example 8, wherein to identify the operational assignment to be performed includes to identify a demand projection for the operational assignment, compare the demand projection with a current fleet assigned to the operational assignment, determine that the current fleet does not satisfy the demand projection based on the comparison, and identify the operational assignment in response to the determination that the current fleet does not satisfy the demand projection.

Example 17 may include a method for assigning a state-of-charge profile to a vehicle, comprising determining battery degradation of a battery of the vehicle, identifying an operational assignment to be performed by the vehicle, selecting the state-of-charge profile from a plurality of state-of-charge profiles for the vehicle, the plurality of state-of-charge profiles generated based on the battery degradation, and the state-of-charge profile selected based on one or more characteristics of the operational assignment, and assigning the state-of-charge profile to the vehicle for the operational assignment.

Example 18 may include the method of example 17, wherein determining the battery degradation of the battery includes identifying an indication of a battery state of the battery received from the vehicle, comparing the battery state with battery degradation profiles generated based on captured battery profiles of other vehicles, and determining the battery degradation of the battery based on the comparison of the battery state with the battery degradation profiles.

Example 19 may include the method of example 17, wherein selecting the state-of-charge profile from the plurality of state-of-charge profiles includes determining ranks for each state-of-charge profile within the plurality of state-of-charge profiles, identifying upper bound values and lower bound values for each state-of-charge profile within the plurality of state-of-charge profiles, and comparing the upper bound values and the lower bound values for each state-of-charge profile within the plurality of state-of-charge profiles with the characteristics of the operational assignment, wherein the state-of-charge profile is selected based on a rank of the state-of-charge profile and an upper bound value and lower bound value satisfying the characteristics of the operational assignment.

Example 20 may include the method of example 17, wherein identifying the operational assignment to be performed by the vehicle includes determining demand projections for a plurality of operational assignments, comparing the demand projections with current fleets of vehicles for each of the plurality of operational assignments, and identifying the operational assignment from the plurality of operational assignments based on a current fleet of vehicles for the operational assignment failing to satisfy the demand projections.

Other Implementation Notes, Variations, and Applications

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

In some embodiments, one or more of the components described throughout this disclosure may be implemented as one or more electrical circuits. The electrical circuits may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In some embodiments, the electrical circuits may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an integrated circuit (IC) that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the digital filters may be implemented in one or more silicon cores in Application Specific Integrated Circuits (ASICs), Field Programmable Gate Arrays (FPGAs), and other semiconductor chips.

Note that with the numerous examples provided herein, interaction may be described in terms of two, three, four, or more electrical components. However, this has been done for purposes of clarity and example only. It should be appreciated that the system can be consolidated in any suitable manner. Any of the disclosed components, modules, and element may be combined in various possible configurations in various embodiments, all of which are within the scope of this disclosure.

Note that in this disclosure, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Numerous changes, substitutions, variations, alterations, and modifications may be ascertained by one skilled in the art and it is to be understood that the present disclosure encompass all such changes, substitutions, variations, alterations, and modifications that may be ascertained by one skilled in the art. Further, it is to be understood that any protection that may be granted based on this disclosure are not to be limited by the description. Rather, the protection is to be defined by the appended claims when read in view of the description and as would be understood by one skilled in the art.

The invention claimed is:

1. One or more non-transitory computer-readable media having instructions stored thereon, wherein the instructions, when executed by a compute system, cause the compute system to:
   identify an operational assignment to be performed;
   determine characteristics for the operational assignment;
   determine state-of-charge profiles for a plurality of batteries associated with a plurality of vehicles based on battery states of the batteries;
   ranking the state-of-charge profiles based on predicted battery lives of the batteries, where state-of-charge profiles with longer predicted battery lives are ranked higher than state-of-charge profiles with shorter predicted battery lives;
   compare a highest ranked state-of-charge profile of the state-of-charge profiles to the characteristics for the operational assignment;
   if the highest ranked state-of-charge profile fails to satisfy the characteristics of the operational assignment, proceed through comparisons of remaining state-of-charge profiles in a descending rank order to the characteristics for the operational assignment until a particular state-of-charge profile for a particular battery associated with a particular vehicle is determined to satisfy the characteristics for the operational assignment; and
   assign the operational assignment to the particular vehicle.

2. The one or more non-transitory computer-readable media of claim 1, wherein the characteristics include allowable charging frequency, allowable charge-times, or expected energy use associated with the operational assignment.

3. The one or more non-transitory computer-readable media of claim 1, wherein the instructions, when executed by the compute system, further cause the compute system to determine marginal costs, or operational costs, for each of the plurality of vehicles for the operational assignment, wherein the operational assignment is further assigned to the particular vehicle based on the marginal costs, or operational costs for each of the plurality of vehicles.

4. The one or more non-transitory computer-readable media of claim 1, wherein the instructions, when executed by the compute system, further cause the compute system to:
identify environmental data or route data for the operational assignment; and
modify a portion of the characteristics for the operational assignment based on the environmental data or the route data identified, wherein the modified portion of the characteristics for the operational assignment are utilized for the comparison(s) of the state-of-charge profiles for the plurality of vehicles to the characteristics for the operational assignment.

5. The one or more non-transitory computer-readable media of claim 1, wherein the state-of-charge profiles for each vehicle within the plurality of vehicles includes include one or more sets of optimal state-of-charge profiles for a battery of the vehicle, and wherein each set of the one or more sets of optimal state-of-charge profiles includes a maximum optimal charge for the battery and a minimum optimal charge for the battery.

6. The one or more non-transitory computer-readable media of claim 1, wherein the instructions, when executed by the compute system, further cause the compute system to:
identify an indication of battery state of the particular battery of the particular vehicle; and
update state-of-charge profiles for the particular vehicle based on the indication of the battery state.

7. The one or more non-transitory computer-readable media of claim 1, wherein the instructions, when executed by the compute system, further cause the compute system to identify state-of-charge profiles for a fleet of vehicles assigned to the operational assignment, wherein comparing the highest ranked state-of-charge profiles to the characteristics for the operational assignment includes comparing the highest ranked state-of-charge profiles to state-of-charge profiles for the fleet of vehicles assigned to the operational assignment.

8. The one or more non-transitory computer-readable media of claim 1, wherein the instructions, when executed by the compute system, cause the compute system to:
assign the particular state-of-charge profile determined to satisfy the characteristics of the operational assignment to the particular vehicle.

9. The one or more non-transitory computer-readable media of claim 1, wherein identifying the operational assignment to be performed includes:
identifying a demand projection for the operational assignment;
comparing the demand projection with a current fleet assigned to the operational assignment;
determining that the current fleet does not satisfy the demand projection based on the comparison of the demand projection with the current fleet; and
identifying the operational assignment in response to the determination that the current fleet does not satisfy the demand projection.

10. A computer-implemented method, comprising:
identifying an operational assignment to be performed;
determining characteristics for the operational assignment;
determining state-of-charge profiles for a plurality of batteries associated with a plurality of vehicles based on battery states of the batteries;
ranking the state-of-charge profiles based on predicted battery lives of the batteries, where state-of-charge profiles with longer predicted battery lives are ranked higher than state-of-charge profiles with shorter predicted battery lives;
comparing a highest ranked state-of-charge profile of the state-of-charge profiles to the characteristics for the operational assignment;
if the highest ranked state-of-charge profile fails to satisfy the characteristics of the operational assignment, proceeding through comparisons of remaining state-of-charge profiles in a descending rank order to the characteristics for the operational assignment until a particular state-of-charge profile for a particular battery associated with a particular vehicle is determined to satisfy the characteristics for the operational assignment; and
assigning the operational assignment to the particular vehicle.

11. The method of claim 10, wherein the characteristics include allowable charging frequency, allowable charge-times, or expected energy use associated with the operational assignment.

12. The method of claim 10, further comprising:
determining marginal costs, or operational costs, for each of the plurality of vehicles for the operational assignment, wherein the operational assignment is further assigned to the particular vehicle based on the marginal costs, or operational costs for each of the plurality of vehicles.

13. The method of claim 10, further comprising:
further ranking the state-of-charge profiles based on operating costs, where state-of charge profiles with lower operating costs are ranked higher than state-of-charge profiles with higher operating costs.

14. The method of claim 10, further comprising:
filtering the state-of-charge profiles that present an expected battery life below a threshold battery life from the state-of-charge profiles.

15. The method of claim 10, wherein the state-of-charge profiles for each vehicle within the plurality of vehicles includes include one or more sets of optimal state-of-charge profiles for a battery of the vehicle, and wherein each set of the one or more sets of optimal state-of-charge profiles includes a maximum optimal charge for the battery and a minimum optimal charge for the battery.

16. The method of claim 10, further comprising:
identifying an indication of battery state of the particular battery of the particular vehicle; and
updating state-of-charge profiles for the particular vehicle based on the indication of the battery state.

17. The method of claim 10, further comprising:
Identifying state-of-charge profiles for a fleet of vehicles assigned to the operational assignment, wherein comparing the highest ranked state-of-charge profiles to the characteristics for the operational assignment includes comparing the highest ranked state-of-charge profiles to state-of-charge profiles for the fleet of vehicles assigned to the operational assignment.

18. The method of claim 10, further comprising:
assigning the particular state-of-charge profile determined to satisfy the characteristics of the operational assignment to the particular vehicle.

19. The method of claim 10, wherein identifying the operational assignment to be performed includes:
identifying a demand projection for the operational assignment;
comparing the demand projection with a current fleet assigned to the operational assignment;
determining that the current fleet does not satisfy the demand projection based on the comparison of the demand projection with the current fleet; and
identifying the operational assignment in response to the determination that the current fleet does not satisfy the demand projection.

20. A computing system, comprising:
one or more processors;
one or more non-transitory computer-readable media to store instructions;
wherein the instructions, when executed by the instructions, cause the one or more processors to carry out the following:
identifying an operational assignment to be performed;
determining characteristics for the operational assignment;
determining state-of-charge profiles for a plurality of batteries associated with a plurality of vehicles based on battery states of the batteries;
ranking the state-of-charge profiles based on predicted battery lives of the batteries, where state-of charge profiles with longer predicted battery lives are ranked higher than state-of-charge profiles with shorter predicted battery lives;
comparing a highest ranked state-of-charge profile of the state-of-charge profiles to the characteristics for the operational assignment;
if the highest ranked state-of-charge profile fails to satisfy the characteristics of the operational assignment, proceeding through comparisons of remaining state-of-charge profiles in a descending rank order to the characteristics for the operational assignment until a particular state-of-charge profile for a particular battery associated with a particular vehicle is determined to satisfy the characteristics for the operational assignment; and
assigning the operational assignment to the particular vehicle.

* * * * *